US008721363B2

(12) United States Patent
Garwood et al.

(10) Patent No.: US 8,721,363 B2
(45) Date of Patent: May 13, 2014

(54) SYSTEMS AND METHODS FOR A POWER ADAPTER

(75) Inventors: Raymond E. Garwood, Miami, FL (US); Nicholas F. Santoro, Davie, FL (US); Carlos M. Rodriguez, Miami, FL (US)

(73) Assignee: Florida Power & Light Company, Juno Beach, FL (US)

( * ) Notice: Subject to any disclaimer, the term of this patent is extended or adjusted under 35 U.S.C. 154(b) by 80 days.

(21) Appl. No.: 13/459,912

(22) Filed: Apr. 30, 2012

(65) Prior Publication Data

US 2012/0276775 A1 Nov. 1, 2012

Related U.S. Application Data

(60) Provisional application No. 61/480,774, filed on Apr. 29, 2011.

(51) Int. Cl.
*H01R 33/945* (2006.01)

(52) U.S. Cl.
USPC .............................. 439/517; 439/146; 439/508

(58) Field of Classification Search
USPC ............................ 439/517, 146, 508; 361/669
See application file for complete search history.

(56) References Cited

U.S. PATENT DOCUMENTS

| | | | | |
|---|---|---|---|---|
| 5,620,337 A | * | 4/1997 | Pruehs | 439/508 |
| 5,704,804 A | * | 1/1998 | Robinson et al. | 439/517 |
| 5,997,347 A | * | 12/1999 | Robinson et al. | 439/517 |
| 6,015,314 A | * | 1/2000 | Benfante | 439/517 |
| 6,104,586 A | * | 8/2000 | Robinson | 361/102 |
| 6,478,589 B2 | * | 11/2002 | Robinson et al. | 439/146 |
| 7,648,389 B1 | * | 1/2010 | Scott et al. | 439/517 |
| 8,177,580 B2 | * | 5/2012 | Feldman et al. | 439/517 |
| 2010/0323555 A1 | * | 12/2010 | Geiger et al. | 439/517 |
| 2011/0159725 A1 | * | 6/2011 | Curto | 439/517 |

OTHER PUBLICATIONS

"Smart Grid Flexibility;" Silver Spring Networks; Access Point; 2011; 2 pages.

* cited by examiner

*Primary Examiner* — Hae Moon Hyeon
(74) *Attorney, Agent, or Firm* — Feldman Gale, P.A.; James A. Gale; Rafael Perez-Pineiro

(57) ABSTRACT

In accordance with one embodiment, an adapter for connecting a network device is provided. The adapter includes adapter housing. The adapter housing further includes a base and a wall, such that the wall extends axially from the base. The base of the adapter housing also includes an inner surface and an outer surface. The adapter includes a plurality of socket openings that extend across the base between the inner surface and the outer surface. The plurality of socket openings extend axially, the socket openings continue across the inner surface of the base through the first end of the rim and the second end of the rim. In one embodiment, the adapter includes a bypass circuit. The bypass circuit allows a network device to get power from a line side of a power meter and the consumer to get power from the load side of the power meter.

18 Claims, 6 Drawing Sheets

SYSTEMS AND METHODS FOR A POWER ADAPTER

CROSS REFERENCE TO RELATED APPLICATIONS

This application claims the benefit of U.S. Provisional Application No. 61/480,774 filed Apr. 29, 2011, the disclosure of which is hereby incorporated herein by reference in its entirety.

BACKGROUND OF THE INVENTION

Embodiments of the present invention generally relate to smart meter networks, and more particularly to a power adapter used in an Advanced Metering Infrastructure (AMI) network.

In an electric utility industry, electric meters are commonly employed to measure electric power consumption at a residential or commercial establishment. The electric meters may be plug-in meters, wherein a socket is mounted on a wall of the residence or building and contains terminals which are connected to electric line and electric load conductors.

Utilities companies that have an AMI set up when necessary use the line side of an AMI power meter to provide power for the AMI infrastructure. Moreover, the AMI meters may provide additional utility as part of the AMI network with respect to conventional power meters. The AMI meters may have inbuilt networking devices for communicating data to a utility company over a network. Optionally, the networking devices may be independent of the AMI power meters. These networking devices may perform data collection and network management within the AMI.

One of the areas where contemporary AMI infrastructure lags is in powering a networking device within the AMI. The networking devices may require additional operational power, independent of the operational power needed for power meters. Traditionally, the operational power for the AMI network devices is drawn from the existing utility distribution system.

Hence there exists a need for a power adapter to provide the operational power to the networking device when a traditional utility distribution source is not available. Additionally, a need exists to provide the operational power to the networking device from a line side, instead of a load side of a power meter.

SUMMARY OF THE INVENTION

The following presents a simplified summary of the invention in order to provide a basic understanding of some aspects of the invention. This summary is not an extensive overview of the invention. Rather than specifically identify key or critical elements of the invention or to delineate the scope of the invention, its purpose, inter alia, is to present some concepts of the invention in a simplified form as a prelude to the more detailed description that is presented later.

In accordance with one embodiment, an adapter for connecting a power meter is provided. The adapter includes an adapter housing. The adapter housing further includes a base and a wall, such that the wall extends axially from the base. The base of the adapter housing also includes an inner surface and an outer surface. The adapter includes a plurality of socket openings that extend across the base between the inner surface and the outer surface. Furthermore, the inner surface of the base contains a plurality of fortifying rims, each having a first end and a second end. The plurality of socket openings extend axially. The socket opening continues across the inner surface of the base through the first end of the rim and the second end of the rim.

A jaw blade pair is configured to be inserted per each socket opening so that the jaw blade pair securely fastens within the socket opening. The jaw blade pair extends from the outer surface of the base and protrudes from the second end of the rim. For example, the adapter may have at least four jaw blade pairs. For example, at least one of a jaw blade may be dedicated for a power line. For example, at least one jaw blade may be dedicated for a neutral line.

The adapter may further include a cotter pin for retaining the jaw blade in the socket opening. In an embodiment of the adapter, a clamp may be part of the jaw blade, such that a retaining screw may secure the jaw blade by screwing the clamp to the adapter base. Optionally, any other securing mechanism may be used to secure the jaw blade within the socket opening. Furthermore, the retaining screw may be used to connect an electrical cable to the jaw blade.

The adapter housing wall includes a first wall surface and a second wall surface. The first wall surface may include a first recess and a second recess, where the first recess securely fastens a first grounding plate and the second recess securely fastens a second grounding plate. Optionally, at least one of the grounding plates provides a mechanism for fastening the base and the wall.

In addition, the power adapter may have a bypass circuit. The bypass circuit allows the operational power for the network device to be drawn from the line side of a power meter wherein a consumer may receive power from the load side of the power meter. For example the consumer may be a residential unit, a commercial unit, and the like or any combination thereof. The bypass circuit of the power adapter may be configured to support at least one of a 100 volt, a 120 volt, a 208 volt, or a 240 volt network device.

In accordance with one embodiment, a method for supplying power to a power meter is presented. The method includes providing an adapter housing having a base and a wall, wherein the wall extends axially from the base, wherein the base may have an inner surface and an outer surface. The method further includes providing a plurality of socket openings extending across the base between the inner surface and the outer surface. The inner surface of the base may have a plurality of fortifying rims, each having a first end and the second end.

In addition, the method provides a jaw blade pair and configuring the jaw blade pair to be insertable per each socket opening. The jaw blade pair may extend from the outer surface of the base and protrudes from the second end of the rim.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following description of the invention when considered in conjunction with the drawings.

BRIEF DESCRIPTION OF THE DRAWINGS

The drawings, in which like numerals represent similar parts, illustrate generally, by way of example, but not by way of limitation, various embodiments discussed in the present document.

DETAILED DESCRIPTION

The foregoing summary, as well as the following detailed description of certain embodiments of the subject matter set forth herein, will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

In the following detailed description, reference is made to the accompanying drawings which form a part hereof, and in which are shown by way of illustration specific embodiments in which the subject matter disclosed herein may be practiced. These embodiments, which are also referred to herein as "examples," are described in sufficient detail to enable those skilled in the art to practice the subject matter disclosed herein. It is to be understood that the embodiments may be combined or that other embodiments may be utilized, and that structural, logical, and electrical variations may be made without departing from the scope of the subject matter disclosed herein. The following detailed description is, therefore, not to be taken in a limiting sense, and the scope of the subject matter disclosed herein is defined by the appended claims and their equivalents. In the description that follows, like numerals or reference designators will be used to refer to like parts or elements throughout. In this document, the terms "a" or "an" are used, as is common in patent documents, to include one or more than one. In this document, the term "or" is used to refer to a nonexclusive or, unless otherwise indicated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
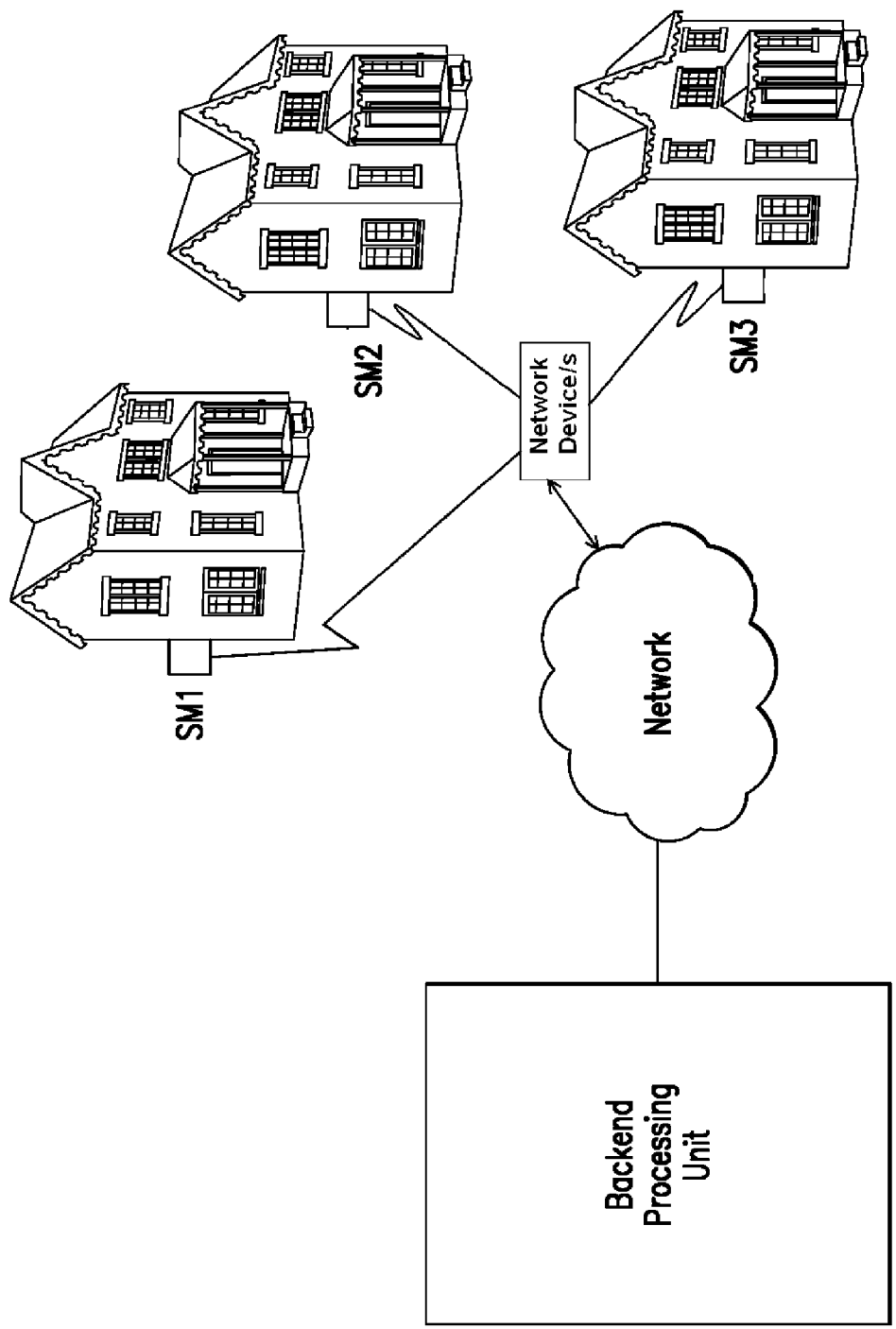
FIG. 1 illustrates a placement of a power adapter within an Advanced Metering Infrastructure (AMI) network in accordance with an embodiment.

FIG. 1 illustrates a placement of a power adapter within an Advanced Metering Infrastructure (AMI) network in accordance with an embodiment. A power adapter is described, wherein the power adapter provides power to access points in an AMI meter network. The subject matter disclosed herein supplies power to an access point by drawing power from a meter socket, which is implemented by modifying a socket extender as be described below.

In one embodiment, the AMI network may be an interconnection of meters SM1-SM3 (wherein S stands for "smart"). For example, the network may be wired or a wireless network. The meters may communicate using a local area network (LAN), a Wi-Fi, a Bluetooth, a radio frequency transceiver with an amplitude modulated signal or a frequency modulated signal or the like. For example, the network may communicate an energy consumption data to a utility company. The AMI may communicate the energy consumption data at intervals. For example, the data may be communicated at an hourly rate, or a daily rate or the like.

The AMI may communicate the data to a remote storage device. For example, the storage device may store the data in a structured format. Additionally, a processing unit may access the stored data to provide analysis based on the stored data. In one embodiment, the processing unit may be a hardware only unit. Optionally the processing unit may be a software only unit. Alternatively, the processing unit may be a combination of the hardware, the software or the like.

The various embodiments and/or components, for example, the modules, elements, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software", "firmware" and "algorithm" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

For example, the processing unit may use the meter data for tracking lower voltage levels or any power events across an entire network. The data may also be used to assist the utility company in planning power supply. For example, the data may be used to plan power load supply to the plurality of networks and/or at different time periods in a day.

The AMI may also have a power supply network between SM1-SM3, to provide power supply to the plurality of network devices (e.g., access points) and the meters. The power supply network, in one configuration may supply 120 volt AC operational power to the access points and the meters. Optionally, the power supply network, in one configuration may supply 208/240 volt AC operational power to the access points and the meters. Optionally, the power adapter may provide bypass power to other ancillary devices that may be used by a utility company in managing the network.

Figure 2:
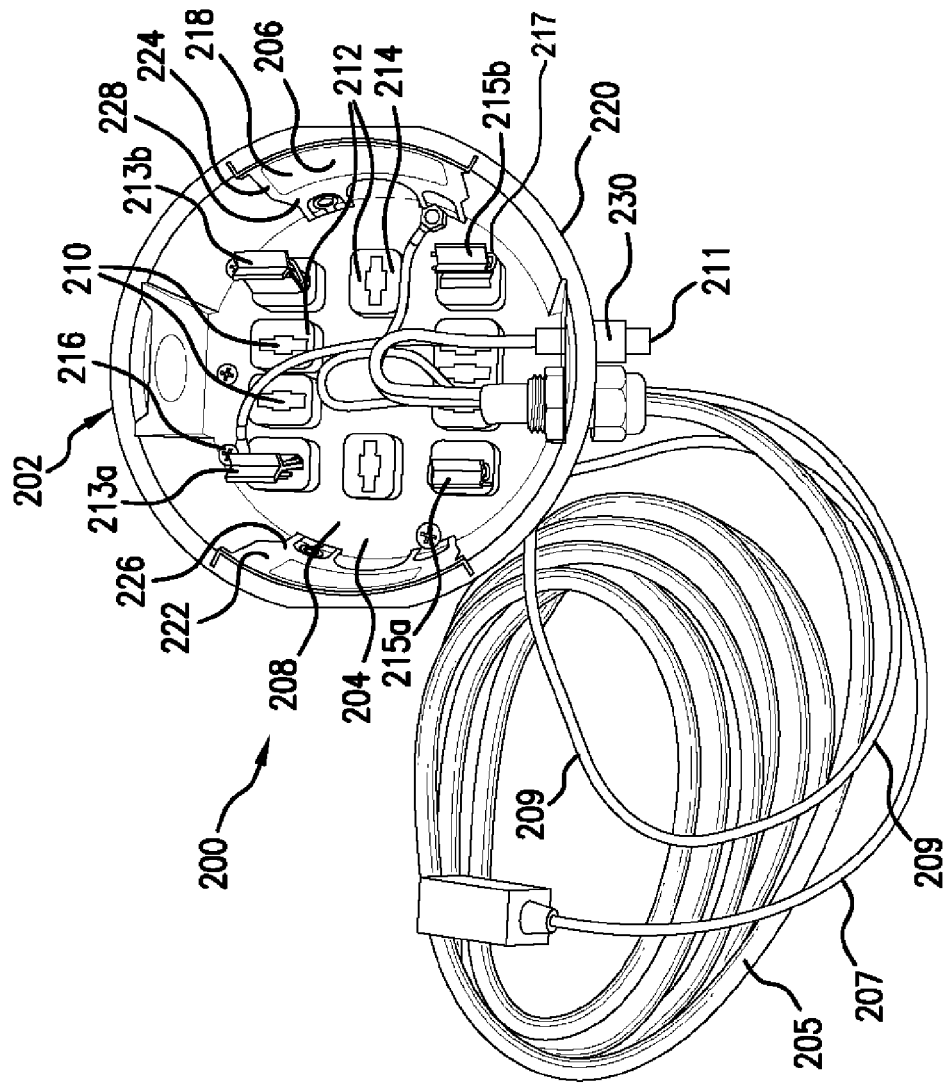
FIG. 2 illustrates the power adapter in accordance with an embodiment.

FIG. 2 illustrates the power adapter 200 in accordance with an embodiment. The power adapter 200 may be one embodiment of a Marwell Socket Adapter Model #E/Z 1000-0-R5 modified to supply power to a network device in an AMI network. For example, the network device may be a data collector that gathers read data from a power meter. Optionally, the network device may include access point radios, or relay radios. The network device may be used generally to refer to any device connected over the network, which may be used by a utility company to communicate data.

In accordance with one embodiment, the power adapter 200 includes adapter housing 202 having a base 204 and a wall 206, such that the wall extends axially from the base 204. The base 204 of the adapter housing 202 also includes an inner surface 208 and an outer surface (not shown). The power adapter 200 may include a plurality of socket openings 210 that extend across the base 204 between the inner surface 208 and the outer surface (not shown). Furthermore, the inner surface 208 of the base 204 contains a plurality of fortifying rims 212, each having a first end (not shown) and a second end 214. The plurality of socket openings 210 extends axially. The socket opening 210 continues across the inner surface 208 of the base through the first end of the rim 212 and the second end 214 of the rim 212.

A jaw blade pair (213, 215) is configured to be inserted per each socket opening 210 so that the jaw blade pair (213, 215) securely fastens within the socket opening 210. The jaw blade pairs (213, 215) extends from the outer surface of the base and protrudes from the second end 214 of the rim 212. For example, the power adapter 200 may have at least four jaw blade pair (213a, b and 215a, b). For example, at least one of a jaw blade may be dedicated for a power line. For example, at least one jaw blade may be dedicated for a neutral line.

The power adapter 200 may further include a cotter pin 217 for retaining the jaw blade (213, 215) in the socket opening 210. In an embodiment of the adapter 200, a clamp may be part of the jaw blade (213, 215), such that a retaining screw 216 may secure the jaw blade (213, 215) by screwing the clamp to the adapter base 208. Optionally, any other securing mechanism may be used to secure the jaw blade within the socket opening. Furthermore, the retaining screw 216 may be used to connect an electrical cable to the jaw blade (213, 215).

The adapter housing wall 206 may include a first wall surface 218 and a second wall surface 220. The first wall surface 218 may include a first recess 222 and a second recess 224, where the first recess 222 securely fasten a first grounding plate 226 and the second recess 224 securely fasten a second grounding plate 228. Optionally, the grounding plate 226, 228 provides a mechanism for fastening the base 204 and the wall 202.

In addition, the power adapter 200 may have a bypass circuit. The bypass circuit allows the operational power for the network device to be drawn from a line side of a power meter and a consumer may receive power from the load side of the power meter. For example the consumer may be a residential unit, a commercial unit, and the like or any combination thereof. The bypass circuit of the power adapter 200 may be configured to support at least one of a 100 volt, a 120 volt, a 208 volt, or a 240 volt network device.

The operational power available via jaw blade 213a may be received from a distribution system. For example, when a power meter is plugged into the power adapter 200, the operational current flows from the jaw blade 213a of the power adapter, via the power meter, to the jaw blade 215a of the power adapter. The circuit formed between jaw blade 213a, the meter and jaw blade 215a, allows the power meter to measure consumption for a customer. Optionally, the operational current may flow from the jaw blades 213a and 213b of the power adapter, via the power meter, to the jaw blades 215a and 215b of the power adapter.

Additionally, a bypass circuit may be formed to supply power to the network device. For example, a 120 volt network device may be supported by a bypass circuit formed between jaw blade 213a, the fuse 211 and the network device through a power cable 205. Optionally, a 208 volt/240 volt network device may be supported by a bypass circuit formed between jaw blade pair 213a and b, the fuse 211 and the network device through the power cable 205. Optionally, the bypass circuit may allow a customer to avoid paying for the power consumed by the network device.

The power adapter 200 may also have a plurality of fuses 211 in order that a network device (shown in FIG. 3) may receive operational power via the plurality of fuses 211. In one exemplary embodiment, as shown in FIG. 2, the fuse 211 may be placed outside the adapter housing. A fuse holder 230 may extend across the first wall surface 218 and the second wall surface 220. The fuse holder may provide a physical conduit as well as an electrical conduit between the inner power adapter 200 circuit and the AMI network device. In one embodiment, the fuse holder 230 may provide capacity to hold at least two fuses. The fuses 211 may be placed in a series or parallel configuration to provide power via a single power cable. Optionally, the holder may provide capacity to hold at least two fuses configured to connect at least two independent cables to the inner power adapter 200 circuit.

For example, the fuse may be a 15 ampere fuse. Optionally, the fuse may support currents between 15-30 ampere. In one embodiment, the fuse may be a glass tube fuse. Alternatively, the fuse may be any other fuse type. For example, the fuse 211 may tap into a jaw blade, which in turn outputs power. The power adapter may further comprise a power cable 205. The power may be passed through the fuse 211 onto the power cable 205, which may connect to a network device. The power adapter 200 may also have a ground cable 207 for grounding a network device, the first grounding plate and the second grounding plate. Furthermore, the power adapter 200 may have a neutral cable 209 to complete the circuit for an AMI network device.

Moreover, the adapter 200 may include a tamper proof module (not shown) that may prevent tampering of the adapter 200. The tamper proof module may provide a security protection or prevent unauthorized tapping in the circuitry of the power adapter. For example, any tamper proofing module may be used that checks for attempts at unauthorized access.

Figure 3:
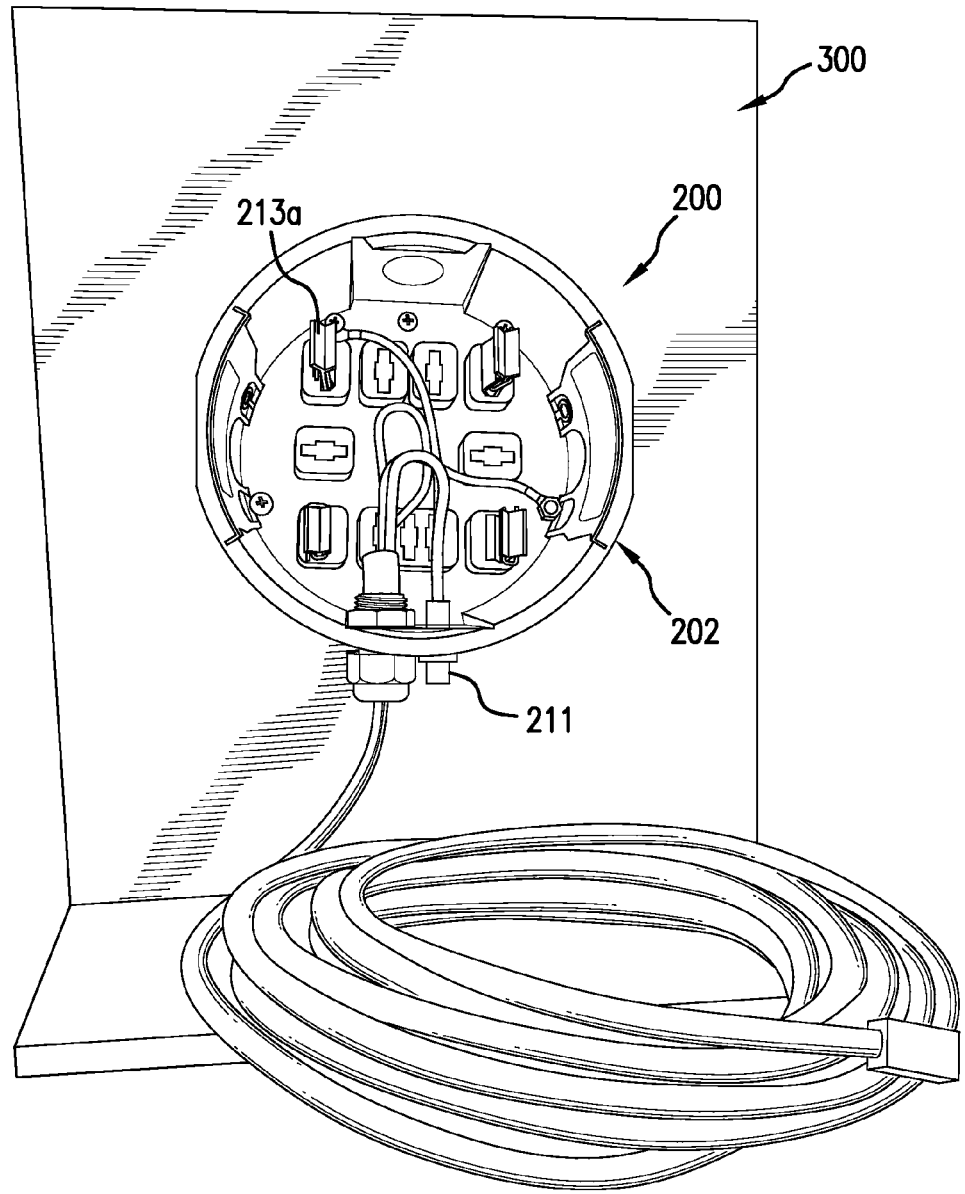
FIG. 3 illustrates the power adapter in a power meter socket in accordance with an embodiment.

FIG. 3 illustrates the power adapter 200 coupled to the power meter socket 300 in accordance with an embodiment. The power adapter 200 may be attached to the power meter socket 300 directly. Alternatively, the bypass circuit may be used to supply power to a backup battery. The backup battery may be used to provide backup operational power to the power meter socket 300 in case of circuit breakage, or during servicing of the power meter socket 300, or the like. Also, the bypass circuit may supply operational power to the power meter socket 300 during installation and thereby avoid any charges to the customer.

For example, the power adapter 200 may be rated for indoor application. Optionally, the power adapter 200 may be rated for an outdoor application. In one embodiment, the power adapter 200 may be made from a carbon based compound. For example, the compound may be fiberglass, polycarbonate any combination thereof and the like.

Figure 4:
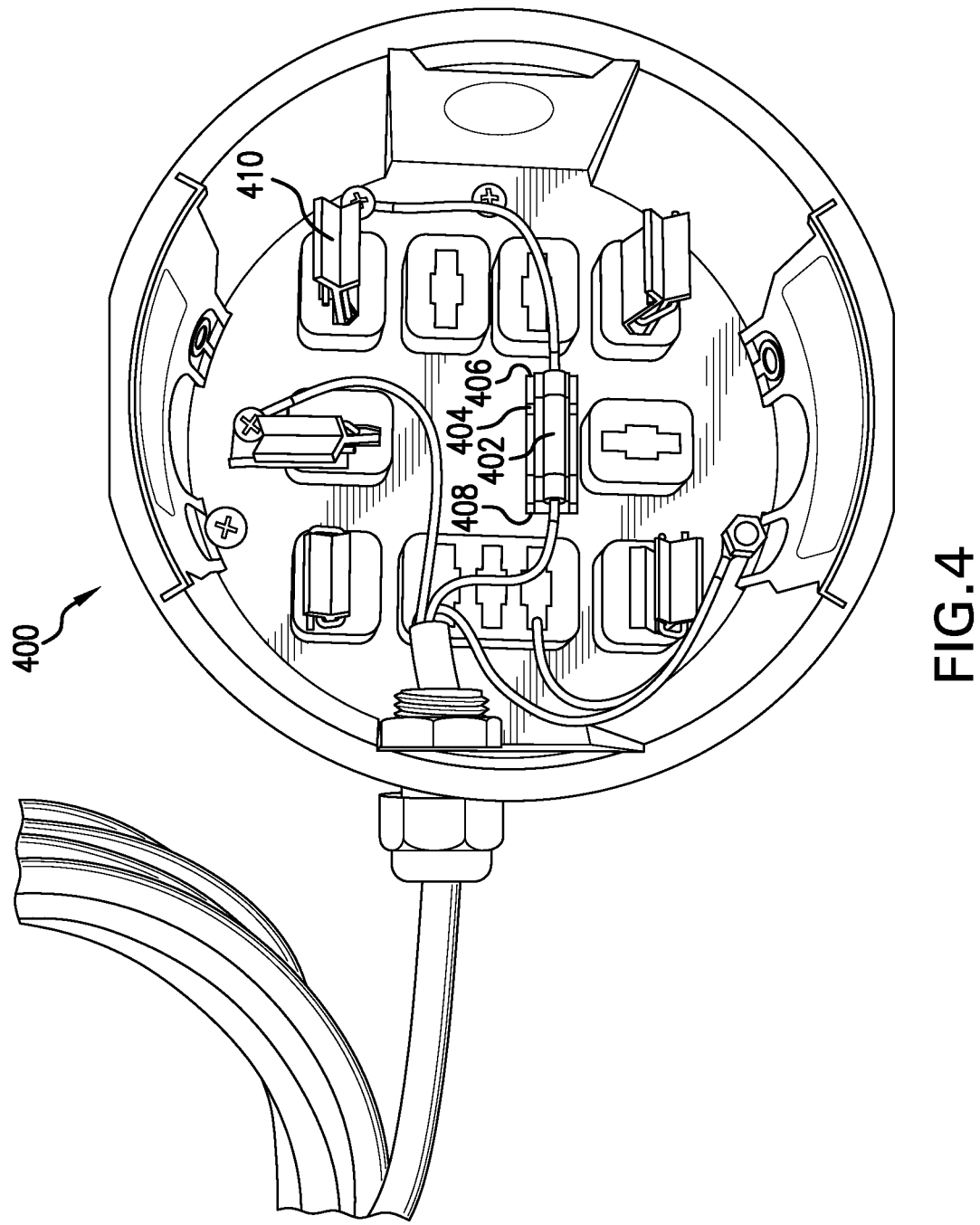
FIG. 4 illustrates the power adapter configured to provide a 120 volts bypass circuit in accordance with an embodiment.
Figure 5:
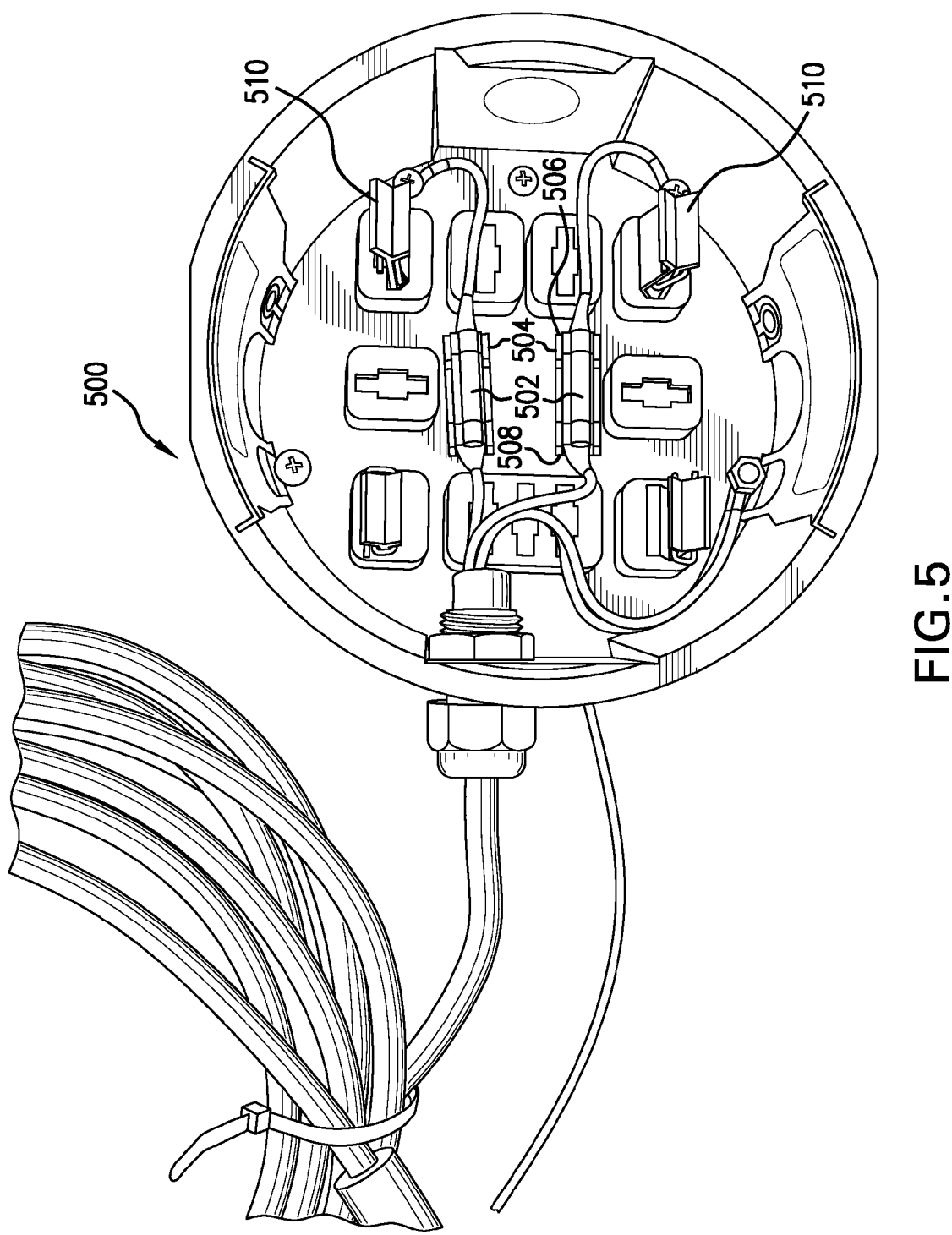
FIG. 5 illustrates the power adapter configured to provide a 208 volts/240 volts bypass circuit in accordance with an embodiment.

FIG. 4 illustrates the power adapter 400 configured to provide a 120 volts bypass circuit in accordance with an embodiment. FIG. 5 illustrates the power adapter 500 configured to provide a 208 volts/240 volts bypass circuit in accordance with an embodiment. FIG. 4 and FIG. 5 show alternate embodiments of the power adapters (400, 500) wherein the fuse (402, 502) and the fuse holder (404, 504) is placed inside the power adapter (400, 500) housing. For a power adapter 400 with a 120 volt network device, one fuse 402 may be used as shown in FIG. 4. Alternatively, for a power adapter 500 with a 208 volt/240 volt network device, two fuses 402 may be used as shown in FIG. 5. The fuse holder 404, 504 of FIG. 4 and FIG. 5 has a first holder end 406, 506 and a second holder end 408, 508. The first holder end 406, 506 is connected to a jaw blade 410, 510. The second holder end 408, 508 is connected to the network device (not shown).

FIGS. 6-10 illustrate the power adapters (600, 700, 800, 900, and 1000) with an alternate jaw blade pair (602, 702, 802, 902, and 1002) configuration in accordance with an embodiment. As referred herein the alternate jaw blade pair (602, 702, 802, 902, and 1002) refers to any blade pair in the respective power adapters (600, 700, 800, 900, and 1000). In one embodiment, the power adapters (600, 700, 800, 900, and 1000) may be configured to connect to a plurality of power meters. For example, the power adapter may have connector for a Form 2S or a Form 12S Meter. The different Form meter may provide the customer 120 V, 208 V, 240V, or the like.

Figure 6:
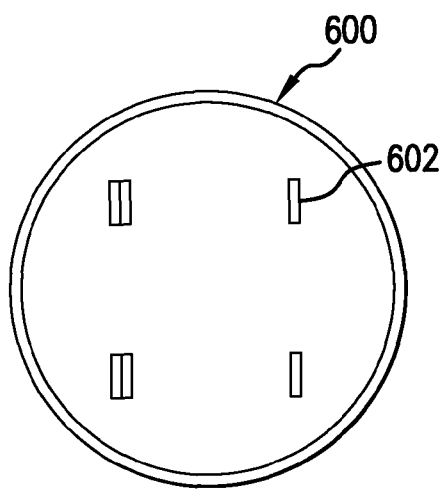
FIGS. 6-10 illustrate the power adapter with alternate jaw blade pair configurations in accordance with an embodiment.
Figure 7:
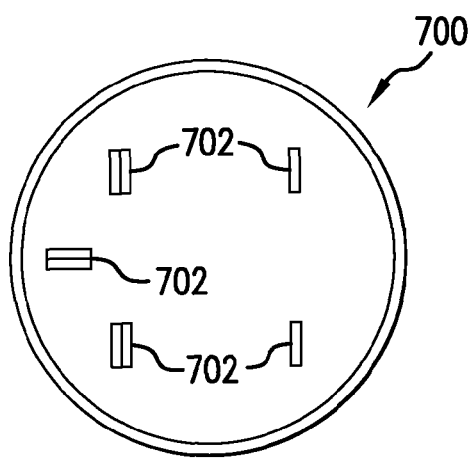
Figure 8:
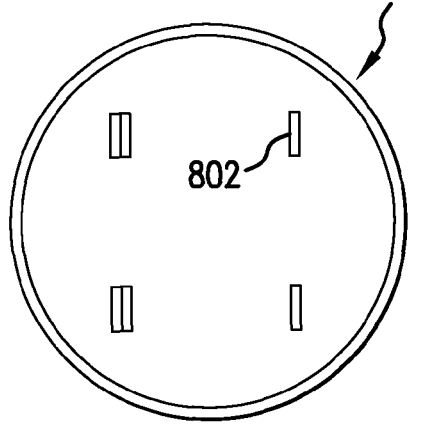

FIG. 6 illustrates a power adapter 600 for a 120/240V, 3-wire connector which may support up to 200 amps. The power adapter configuration in FIG. 6 may be referred to as a Form 1S jaw blade 602 configuration power adapter. FIG. 7 illustrates a power adapter 700 for a 120/208V, 3-wire which may support up to 400 amps. The power adapter 700 configuration in FIG. 7 may be referred to as a Form 12S jaw blade 702 configuration power adapter. FIG. 8 illustrates a power adapter 800 for a 120/240V, 3-wire which may support 201-400 amps. The power adapter 800 configuration in FIG. 8 may be referred to as an alternate 2S jaw blade 802 configuration power adapter. For example, the power adapter (600, 700, 800, 900, and 1000) in FIGS. 6-8 may be for a single-phase circuit.

Figure 9:
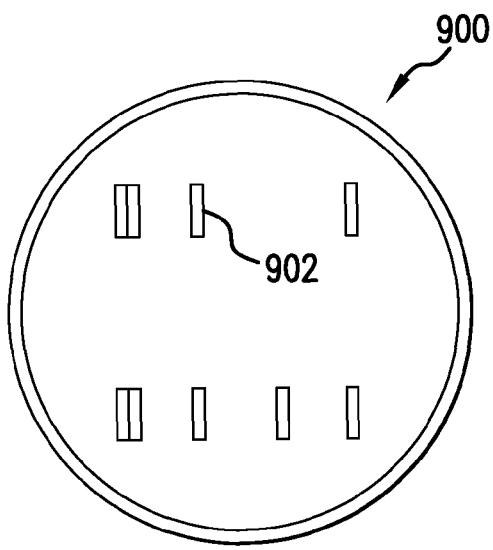
Figure 10:
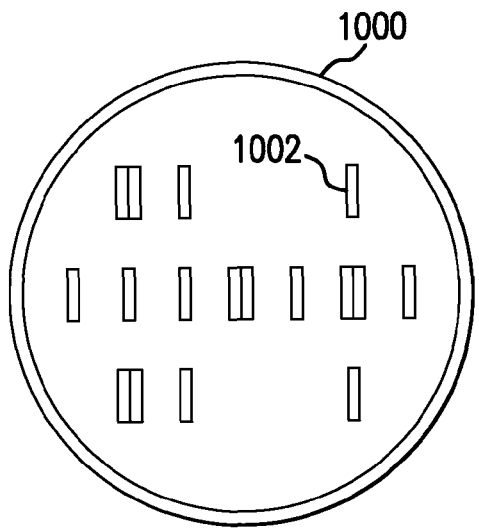

FIG. 9 illustrates a three-phase—120/208V, 4-wire, 120/240V, 4-wire, and 277/480V, 4-wire—power adapter 900 configuration which supports up to 400 amps. The power adapter 900 configuration in FIG. 9 may be a Form 16S jaw blade 902 configuration power adapter 900. FIG. 10 illustrates a three-phase—120/208V, 4-wire, 120/240V, 4-wire, and 277/480V, 4-wire—power adapter 1000 configuration which supports current above 400 amps. The power adapter 1000 configuration in FIG. 10 may be referred to as an alternate 9S configuration jaw blade 1002 power adapter 1000.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions, types of materials and coatings described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An adapter for connecting a power meter, the adapter comprising:
    an adapter housing having a base and a wall extending axially from the base;
        the base having an inner surface and an outer surface;
        the base having a plurality of socket openings extending across the base between the inner surface and the outer surface;
        the inner surface of the base having a plurality fortifying rims having a first end and a second end;
        the plurality of socket openings extending axially from the inner surface of the base, the first end of the rim and the second end of the rim;
    a jaw blade pair configured to be securely insertable per each socket opening, where the jaw blade pair extends from the outer surface of the base and protrudes from the second end of the rim; and
    a bypass circuit, the bypass circuit being configured to provide power to a network device from a line side of the power meter so that the customer is not billed for power consumed by the network device;

the bypass circuit being further configured to provide power to said customer from a load side of the power meter.

2. The adapter of claim 1, wherein the wall has a first wall surface and a second wall surface;

the first wall surface comprising a first recess and a second recess; and the first recess securely fastens a first grounding plate and the second recess securely fastens a second grounding plate.

3. The adapter of claim 2, wherein at least one of the grounding plates provides a mechanism for fastening the base and the wall.

4. The adapter of claim 1, further comprising at least four jaw blade pairs.

5. The adapter of claim 1, further comprising a plurality of fuses, wherein a network device receives electricity via the plurality of fuses.

6. The adapter of claim 1, wherein the network device is at least one of a 120 volt, a 208 volt or a 240 network device.

7. The adapter of claim 1, wherein the network device communicates data over a wired or a wireless network.

8. The adapter of claim 1, further comprising at least a jaw blade dedicated for a power line.

9. The adapter of claim 1, further comprising at least a jaw blade dedicated for a neutral line.

10. The adapter of claim 1, further comprising tamper proofing module.

11. The adapter of claim 1, further comprising a fastener for retaining a jaw blade in the socket opening, wherein the fastener securely fastens to the jaw blade to the adapter.

12. The adapter of claim 1, wherein a retaining screw is used to connect an electrical cable to the jaw blade.

13. A method for providing power to a network device, the method comprising:

providing an adapter housing having a base and a wall extending axially from the base, wherein the base having an inner surface and an outer surface;

providing a plurality of socket openings extending across the base between the inner surface and the outer surface, wherein the inner surface of the base having a plurality fortifying rims having a first end and the second end;

the plurality of socket openings extending axially from the inner surface of the base, the first end of the rim and the second end of the rim;

providing a plurality of jaw blade pairs;

configuring each jaw blade pair to be insertable per each socket opening, wherein the jaw blade pair extends from the outer surface of the base and protrudes from the second end of the rim; and providing a bypass circuit, wherein the bypass circuit is configured to provide power to the network device from a line side of the power meter so that the customer is not billed for power consumed by the network device; the bypass circuit being further configured to provide power to said customer from a load side of the power meter.

14. The method of claim 13 further comprises providing the wall with a first wall surface and a second wall surface;

providing a first recess and a second recess within the first wall surface;

fastening a first grounding plate within the first recess; and fastening a second grounding plate within the second recess.

15. The method of claim 13, wherein at least one of the grounding plates provides a mechanism for fastening the base and the wall.

16. The methods of claim 13, wherein the network device has an operating range up to 360 volts.

17. The method of claim 13, further comprising providing a plurality of fuses, wherein the network device receives electricity via the plurality of fuses.

18. The method of claim 13, further comprising providing a fastener for retaining a jaw blade in the socket opening, wherein the fastener securely fastens the jaw blade to the power adapter.

\* \* \* \* \*